United States Patent [19]

Shariff

[11] 4,274,576
[45] Jun. 23, 1981

[54] CRYOGENIC CHIP REMOVAL TECHNIQUE

[75] Inventor: Rafique S. Shariff, LaGrangeville, N.Y.

[73] Assignee: International Business Machines Corporation, Armonk, N.Y.

[21] Appl. No.: 93,321

[22] Filed: Nov. 13, 1979

[51] Int. Cl.$^3$ ............................................. B23K 28/00
[52] U.S. Cl. ...................................... 228/264; 228/13; 228/46; 29/426.4; 29/426.5; 225/93.5
[58] Field of Search .................... 228/264, 200, 57, 13, 228/46; 29/426.1, 426.2, 426.4, 426.5; 225/93.5, 102; 241/DIG. 37

[56] References Cited

U.S. PATENT DOCUMENTS

| 3,556,366 | 1/1971 | Kim | 225/93.5 X |
| 3,969,813 | 7/1976 | Minetti et al. | 29/426.5 X |

OTHER PUBLICATIONS

IBM Technical Disclosure Bulletin, vol. 19, No. 3, Aug. 1976, pp. 939-940, "Cleaning of Solder Pads Prior to Reword Operation".

Primary Examiner—Richard B. Lazarus
Attorney, Agent, or Firm—James E. Murray

[57] ABSTRACT

A semiconductor chip mounted on a substrate by solder columns connecting one side of the chip to the substrate, is removed from the substrate by cooling the unconnected side of the chip to embrittle the solder columns and then twisting the chip with small angle rotational motion to shear the columns at their midpoints. A mechanism for cooling and rotating the chip makes use of the cooling substance to minimize the contact of the substrate with the cooling substance.

8 Claims, 3 Drawing Figures

U.S. Patent  Jun. 23, 1981  4,274,576
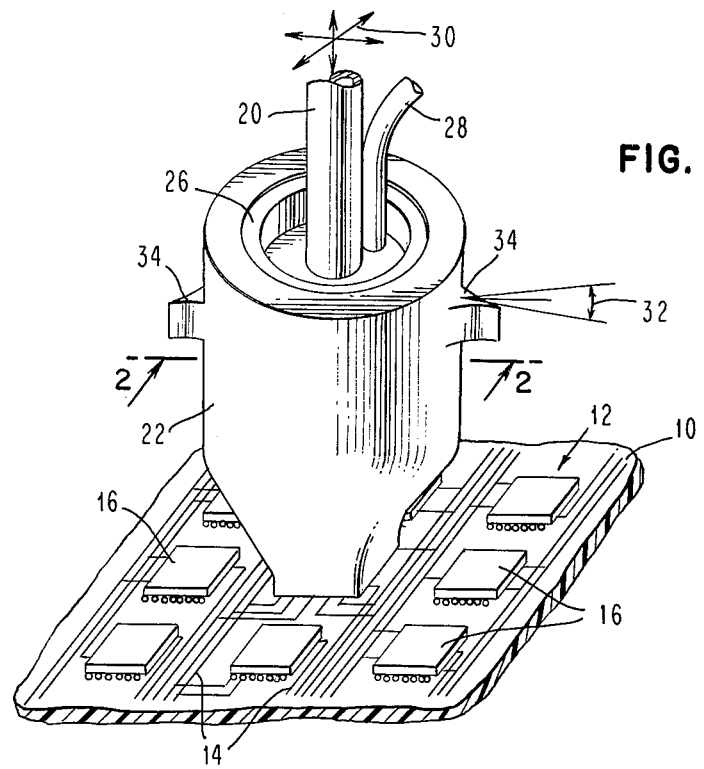
FIG. 1
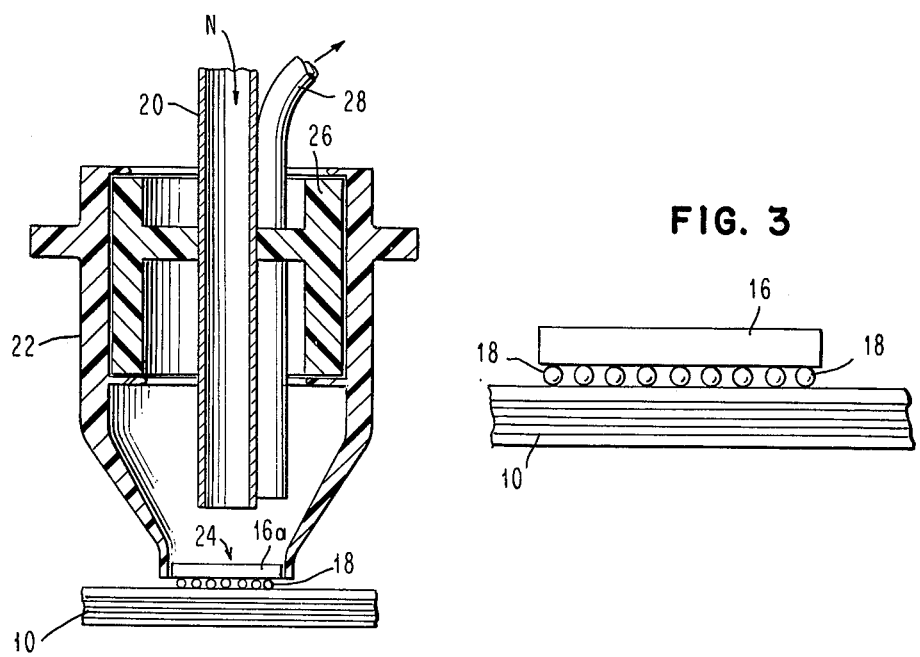
FIG. 2
FIG. 3

CRYOGENIC CHIP REMOVAL TECHNIQUE

INTRODUCTION

The present invention relates to the removal of semiconductor chips mounted on an insulative substrate by solder columns connecting electrical circuits on the chip to an interconnection network on and/or in the substrate and more particularly, it relates to the removal of such semiconductor chips by the rotation of the chip relative to the surface of the substrate in a manner that will fracture the solder columns.

BACKGROUND OF THE INVENTION

In certain integrated circuit layouts, a multitude of monolithic semiconductor devices are mounted on an insulative substrate with an electrical interconnection network that interconnects the semiconductor circuit chips. The chips are mounted at chip sites on the substrate by solder columns that join terminals of the chips to the interconnection network.

One technique for forming these solder columns involves fusing solder balls at each of the chip terminals to pads on the substrate with a solder reflow technique. This technique is described in U.S. Pat. No. 3,429,040, and in the article "A Critique of Chip Joinings Techniques" by L. F. Miller, beginning on page 50 of the April, 1970 issue of Solid State Technology.

With a large number of semiconductor chips on a substrate, it becomes necessary from time to time to remove a defective chip from the substrate and replace it with an operating chip. One technique for removing the defective chip is to repeatedly twist the chip relative to the substrate until the solder columns rupture. This removal technique has a number of problems. One of them is that it leaves a residue from the solder columns at the chip site which must be removed before a new chip can be attached to the substrate at that site. Another problem with the technique is that it sometimes results in damage to the interconnection network on the substrate.

One method for removing the residue of the solder columns from the chip site can be found in U.S. Application Ser. No. 036,912 which was filed May 7, 1979, and now abandoned and is entitled "Apparatus and Method for Rework Dressing of Chip Site". In this method, a mask is placed over the chip site. This mask has holes in it that expose the remnants of the solder columns while shielding the remainder of the chip site. A brush is then used to remove the excess solder of the remnants.

A difficulty with this chip site dressing method, is that in order for it to work satisfactorily, the residue solder columns must be substantially perpendicular to fit through the openings in the mask. If they are bent one direction during the removal of the chip, which frequently happens with the described chip removal technique, the mask will not fit over the residue of the solder columns and the dressing technique cannot be employed. Furthermore, the dressing method does not compensate for the removal of too much solder from the chip site by the chip removal technique.

The use of embrittlement caused by cooling to strip insulation off is described in U.S. Pat. No. 3,936,922 and U.S. Pat. No. 3,556,366, describes the use of thermal shock to fracture semiconductor substrates.

THE INVENTION

Therefore, in accordance with the present invention, an improved chip removal technique using cooling is provided which places a minimum of stress on the substrate at the chip site and leaves the solder columns that are substantially vertical. In this technique, the side of the chip not connected to the substrate by the solder columns is cooled until the solder columns become embrittled. Then, the previously mentioned twisting of the chip is performed. The twisting is done delicately through a very small angle and results in the columns breaking off somewhere at their midpoints without substantial bending of the columns. Furthermore, the number of twisting motions, and their extent and severity are reduced. Due to the exertion of minimal force during removing and the breaking of the columns at their midpoints, little damage is done to the substrate or its interconnection network. In addition, the verticality and size of the residue columns enable the efficient use of the solder column residue removal technique described above.

To perform this removal operation, a tool is provided which has a conduit that directs cooling fluid into a chamber in a shroud. The shroud has an opening which fits over the chip so that the face of the chip is exposed to liquid entering the chamber from the conduit. The opening configured to the form of the chip and is slightly larger than the chip so that it fits easily over the chip selected for removing. However, when the cooling fluid enters the chamber within the shroud, the cooling of the shroud causes the opening in the shroud to shrink resulting in the sidewalls of the opening clamp to the chip sealing the chamber preventing the cooling fluid from thereafter contacting the surface of the substrate and causing thermal shock to the interconnection network on the substrate. The clamping of the chip also facilitates removal of the chip from the chip site. It permits the chip to be lifted by the tool from the site once the connections to the substrate have been fractured.

Therefore, it is an object of the present invention to provide a new chip removal technique.

It is another object of the present invention to provide a new chip removal tool.

Other objects of the present invention are to provide a chip removal technique and/or tool which results in minimum damage to the substrate and its interconnection network and/or facilitates the mounting of a replacement chip at the same chip site on the substrate.

THE DRAWINGS

The foregoing and other objects, features and advantages of the present invention will be apparent from the following more particular description of the invention as illustrated in the accompanying drawings of which:

FIG. 1 is an isometric view of the tool in accordance with the present invention being used to remove a chip from a semiconductor substrate;

FIG. 2 is a section along line 22 in FIG. 1; and

FIG. 3 is a side view of one of the chips on the substrate shown in FIG. 1.

DETAILED DESCRIPTION

Referring to FIG. 1, an insulative substrate 10 has a plurality of chip sites 12 thereon defined by connection sites in an interconnection network 14 that connects the chip sites to one another and to pins for the substrate 10.

The substrate is a multi layer ceramic with the interconnection network on its top surface and dispersed between its various layers.

Because of its complexity, the substrate package is relatively expensive relative to any one of the chips mounted thereon. Therefore, when one of the chips is defective, it is desirable to remove the defective chip and replace it with a good chip to salvage the substrate package.

Monolithic circuit chips 16 are mounted at the chip sites 12 on solder columns 18 that connect the circuits on the chip to the connectors of the interconnection network 14. These solder columns 18 are formed by fusing solder balls at each of the chip terminals to pads in the interconnection network 14 by solder reflow.

In FIG. 3, a representative row of eleven columns 18 are shown. In an actual chip, there could be many more solder columns in a row, and there could be N such rows where N is the number of solder columns in a row. As shown in FIGS. 1 and 2, a pipe 20 is suspended over a defective chip 16a that is to be removed with the opening in the pipe directly over the surface of the chip. This pipe 20 is positioned within a generally cyclindrical shroud 22 that tapers at one end to a square opening 24. The square opening is fitted over the chip 16a during removal of the chip. The pipe 20 is force fitted in an opening through a cylindrical member 26 that rides between two angular ribs in the interior wall of the shroud.

In addition to the pipe 20 for introduction of the cooling fluid into the chamber, there is a second pipe for exhausting gases from the chamber which is force fitted through a hole in the cylindrical member.

The whole package has possible movement along three orthogonally oriented axis 30 so that it can be moved over the surface of the substrate in any direction, and its height changed enabling the device to be easily placed over any selected chip on the substrate 10 such as the defective chip 16a. In addition, the shroud 22 can be rotated 32 in a horizontal plan with respect to the remainder of the removal package and the substrate package. Both the shroud 22 and the cylindrical member 26 are made of a self lubricating plastic such as polytetrafloroethylene. The cooling liquid is liquid nitrogen and the pipes are copper.

In operation, the whole removal package is moved until it is positioned over the defective chip 16a with the defective chip positioned in the opening to the cavity of the shroud 22. Then the liquid nitrogen is sprayed into the cavity through the pipe 20 causing the shroud to shrink and in shrinking, clamp the sidewalls of the opening 22 to the edges of the chip 16a preventing the liquid nitrogen spray from escaping through the opening and causing thermal damage to the substrate or the interconnection networks. The spray also cools the chip 16a and solder columns 18. This localized cooling is in the range of approximately $-10$ to $-20$ degrees celsius. Due to this cooling, the solder columns become embrittled and snap quite easily when the shroud 22 is hand torqued by twisting the members 34 a few cycles (3 to 5) through a small angular displacement ($\pm 1$ degree). The solder columns 18 break at about their midpoint and do so without significant bending making them ideal for dressing the site for a new chip in accordance with the dressing scheme of the above mentioned patent application.

One embodiment of the invention has been described. Obviously, a number of changes can be made without departing from the spirit and scope of the invention.

Having thus described our invention, what we claim as new, and desire to secure by Letters Patent is:

1. The method of removing a semiconductor chip attached to a ceramic substrate by a plurality of solder columns, comprising the steps of:
   chilling said columns to cause embrittlement thereof,
   rupturing said columns which so chilled by moving said chip relative to said substrate, and
   therefter moving said chips away from said substrate.

2. The method of claim 1 wherein said movement of the chips is a rotational motion around substantially the center of the chip.

3. The method of claim 2 wherein said columns are chilled by application of a cooling substance to the chip.

4. The method of claim 3 wherein the cooling substance is liquefied gas.

5. The method of claim 4 including,
   applying the cooling substance to the chip in a shroud which substantially shields the substrate from the cooling substance.

6. The method of claim 5 wherein said cooling substance is liquid nitrogen.

7. Apparatus for removing a semiconductor chip mounted on an insulating substrate by solder columns electrically connecting circuits on the side of the chips facing the substrate to an interconnecting network on the substrate comprising:
   conduit means for applying a cooling fluid to the surface of the chip facing away from the substrate,
   a shroud means for forming a cavity over the end of the conduit means applying the cooling fluid to the surface of the chip to prevent the fluid from spilling on the substrate, said shroud having an opening to said cavity substantially conforming to the shape of the chip into which the chip fits, said opening being slightly larger than the chip at room temperature, said shroud means being formed of a material which has coefficient of thermal expansion which is greater than the chip so that the opening shrinks relative to the chip and seals against the sides of the chip when the cooling fluid is introduced into the shroud; and
   rotation means for imparting rotational movement to said shroud when the chip is within the shroud.

8. The apparatus of claim 7 wherein said shroud includes,
   an outer shell with said opening therein which moves with said rotational motion, and an inner portion to which the conduit means is attached that remains substantially stationary with said rotational motion.

* * * * *